(12) United States Patent
Wei et al.

(10) Patent No.: US 8,829,777 B2
(45) Date of Patent: Sep. 9, 2014

(54) CERAMIC WAVELENGTH CONVERTER AND LED LIGHT SOURCE CONTAINING SAME

(75) Inventors: George C. Wei, Weston, MA (US);
Steven Mackel, Pepperell, MA (US);
Madis Raukas, Charlstown, MA (US);
Frank Jermann, Koenigsbrunn (DE);
Tim Fiedler, Munich (DE)

(73) Assignee: OSRAM Sylvania Inc., Danvers, MA (US)

( * ) Notice: Subject to any disclaimer, the term of this patent is extended or adjusted under 35 U.S.C. 154(b) by 1017 days.

(21) Appl. No.: 12/891,249

(22) Filed: Sep. 27, 2010

(65) Prior Publication Data
US 2012/0075834 A1    Mar. 29, 2012

(51) Int. Cl.
| | |
|---|---|
| H01J 1/62 | (2006.01) |
| H05B 33/14 | (2006.01) |
| C04B 35/645 | (2006.01) |
| H01L 33/50 | (2010.01) |
| C04B 35/515 | (2006.01) |
| C09K 11/77 | (2006.01) |
| C04B 35/22 | (2006.01) |

(52) U.S. Cl.
CPC ............ *C09K 11/7734* (2013.01); *H05B 33/14* (2013.01); *C04B 35/645* (2013.01); *C04B 2235/652* (2013.01); *C04B 2235/3206* (2013.01); *H01L 33/505* (2013.01); *C04B 2235/3445* (2013.01); *C04B 2235/3208* (2013.01); *C04B 2235/3873* (2013.01); *C04B 2235/3213* (2013.01); *C04B 2235/444* (2013.01); *C04B 2235/656* (2013.01); *C04B 2235/6582* (2013.01); *C04B 2235/3454* (2013.01); *C04B 2235/3203* (2013.01); *C04B 2235/3262* (2013.01); *C04B 2235/3229* (2013.01); *C04B 2235/5436* (2013.01); *C04B 2235/3224* (2013.01); *C04B 35/5152* (2013.01); *C04B 35/22* (2013.01); *C04B 2235/77* (2013.01); *C04B 2235/80* (2013.01); *C04B 2235/6567* (2013.01); *C04B 2235/445* (2013.01); *C04B 2235/9661* (2013.01); *C04B 2235/668* (2013.01)
USPC ............................ 313/501; 313/506; 428/690

(58) Field of Classification Search
USPC .................... 313/501, 504, 506, 507; 428/690
See application file for complete search history.

(56) References Cited

U.S. PATENT DOCUMENTS

| | | | |
|---|---|---|---|
| 4,073,845 | A | 2/1978 | Buljan et al. |
| 4,179,301 | A | 12/1979 | Buljan |

(Continued)

FOREIGN PATENT DOCUMENTS

| | | | |
|---|---|---|---|
| DE | 10 2007 028 120 A1 | 12/2008 | |
| EP | 1837386 A1 | 9/2007 | |

(Continued)

OTHER PUBLICATIONS

J. Wang et al., The photoluminescence and thermoluminescense properties of novel green long-lasting phosphorescence materials Ca8Mg(Si04)4 Cl2:Eu2+, Nd3+; Applied Physics B 87, pp. 249-254 (2007).

(Continued)

*Primary Examiner* — Mary Ellen Bowman
(74) *Attorney, Agent, or Firm* — Robert F. Clark

(57) ABSTRACT

There is herein described an LED light source comprising an LED and a ceramic wavelength converter positioned to receive at least a portion of the light emitted by said LED, said ceramic wavelength converter converting at least a portion of the light emitted by said LED into light of a different wavelength, said ceramic wavelength converter comprising a chlorosilicate phosphor and having a density at least about 90% of theoretical density. The chlorosilicate phosphor is preferably a green-emitting $Ca_8Mg(SiO_4)_4Cl_2:Eu^{2+}$ phosphor.

14 Claims, 3 Drawing Sheets

(56) References Cited

U.S. PATENT DOCUMENTS

| | | | |
|---|---|---|---|
| 6,504,179 B1 | 1/2003 | Ellens et al. | |
| 6,953,952 B2 | 10/2005 | Asakawa | |
| 2005/0104503 A1* | 5/2005 | Ellens et al. | 313/486 |
| 2005/0269582 A1 | 12/2005 | Mueller et al. | |
| 2006/0202105 A1 | 9/2006 | Krames et al. | |
| 2007/0126017 A1 | 6/2007 | Krames et al. | |
| 2007/0126356 A1* | 6/2007 | Tanda et al. | 313/512 |
| 2009/0121608 A1* | 5/2009 | Xie et al. | 313/364 |

FOREIGN PATENT DOCUMENTS

| | | |
|---|---|---|
| KR | 10-0784573 | 12/2007 |
| WO | WO2006/087660 A1 | 8/2006 |
| WO | WO2006/111906 A1 | 10/2006 |
| WO | 2007/052200 A1 | 5/2007 |
| WO | 2007/099862 A1 | 9/2007 |

OTHER PUBLICATIONS

Q. Zeng et al., Ba5SiO4Cl6:Eu2+: An intense blue emission phosphor under vacuum ultraviolet and near-ultraviolet excitation; Applied Physics Letter 88; 051906 (2006) 1-4.

J. Wang et al., Luminescent Properties of (Ca1-xSrx)3SiO4 (Cl1-yFy)2:Eu2+ Phosphors and Their Application for White LED; International journal of Applied Ceramic Technology. 6 [4] 447-452 (2009).

J. Kechele et al., Structure elucidation of BaSi2O2N2—A host lattice for rare-earth doped luminescent materials in phosphor-converted (pc)-LEDs; Solid State Sciences, 11 (2009) 537-543.

K-S. Sohn et al., Luminescence of Sr2SiO4-xN2x/3:Eu2+ Phosphors Prepared by Spark Plasma Sintering; Journal of the Electrochemical Society; 155 (2) J58-J61 (2008).

R-J. Xie et al., Photoluminescence of Cerium-Doped alpha-SiAlON Materials; J. Am. Ceram. Soc. 87 [7] 1368-1370 (2004).

R-J. Xie et al., Preparation and Luminescence Spectra of Calcium- and Rare Earth (R=Eu, Tb, and Pr)-Codoped alpha-SiAlON Ceramics; J. Am. Ceram. Soc. 85 [5] 1229-1234 (2002).

N. Kuramoto et al., Development of translucent aluminum nitride ceramics; Journal: Ceramic Bulletin vol. 68 Issue 4, 883-887 (1989).

R. Mueller-Mach et al., All-nitride monochromatic amber-emitting phosphor-converted light-emitting diodes; Phys. Status Solidi RRL, 1-3 (2009).

V. Bachman et al., Color Point Tuning for (Sr,Ca,Ba)si2O2N2:Eu2+ for White Light LEDs; Chem. Mater. 2009, 21 316-325.

R. Mueller-Mach, Lumiramic TM—a new approach in phosphor converted LEDS, Philips Lumileds Lighting Company, Advanced Laboratories, San Jose, CA USA; Global Phosphor Summit, San Diego, Mar. 4, 2008.

N. Park et al., Photoluminesence and phase studies on Ca8-xSrxMg(SiO4)4Cl2:Eu2+ phosphor, J. Mater. Sci. Lett. 13, 1252-1253.

N. Kuramoto et al., Transparent AlN ceramics; Journal of Materials Science Letters (1984) 471-474.

R-J. Xie et al., Eu2+-doped Ca-alpha-SiAlON: a yellow phosphor for white light-emitting diodes; Applied Physics Letters, vol. 84, No. 26, Jun. 28, 2004, 5404-5406.

R-J. Xie et al., Highly efficient white-light emitting diodes fabricated with short-wavelength yellow oxynitride phosphors, Applied Physics Letters, 88, 101104-1, (2006).

M. Mitomo, Sintering of Si3N4 with Al2O3 and Y2O, Yogyo-Kyokai-Shi, 85 [8] (1977) 408-412.

Abstract, DE 10 2007 028 120 A1 (Dec. 24, 2008).

* cited by examiner

CERAMIC WAVELENGTH CONVERTER AND LED LIGHT SOURCE CONTAINING SAME

TECHNICAL FIELD

This application relates to LED-based light sources and more particularly to phosphor conversion LEDs wherein a phosphor is used to convert at least a portion of the light emitted by the LED into light having a different peak wavelength.

BACKGROUND OF THE INVENTION

An increasing number of lighting systems employ light emitting diodes (LED or LEDs) because of their small size, low power requirements and general lack of excessive heat generation during operation. Many single color light emitting diodes are available; however, in the area of green emission there exists the so-called "green gap" where optimum color efficiency is not available. Therefore, it would be an advance in the art to fill this "green gap" with a light source that is convenient and economical to manufacture.

When it is desired to construct an LED light source that produces a color different from the output color of the LED, it is known to convert the LED light output having a peak wavelength (the "primary light") to light having a different peak wavelength (the "secondary light").

The conversion process involves absorbing the primary light by a wavelength-converting material such as a phosphor or mixture of phosphors thereby exciting the phosphor material, which emits the secondary light. The peak wavelength of the secondary light depends on the type of phosphor material, which can be chosen to provide secondary light having a particular peak wavelength. This process may be generally referred to as "wavelength conversion" and an LED combined with a wavelength-converting material, such as phosphor, to produce secondary light, may be described as a phosphor conversion LED (pc-LED).

In a known configuration, an LED die, such as a III-V nitride die, is positioned in a reflector cup package and a volume, conformal layer or a thin film including wavelength-converting material is deposited directly on the surface of the die. In another known configuration, the wavelength-converting material may be provided in a solid, self-supporting flat plate, such as a ceramic plate, single crystal plate, or thin film structure. The plate may be attached to the LED, e.g. by wafer bonding, sintering, gluing, etc. Such a plate may be referred to herein as a "wavelength-converting plate." Another known approach is to provide the wavelength-converting material in a solid, self-supporting dome formed separately from the LED and attached thereto.

SUMMARY OF THE INVENTION

It is an object of the invention to obviate the above enumerated disadvantages of the prior art.

It is another object of the invention to enhance LED light sources and methods of making such light sources.

Yet another object of the invention is the improvement of green-emitting light sources.

These objects are accomplished, in one aspect of the invention, by an LED light source, comprising an LED and a ceramic wavelength converter positioned to receive at least a portion of the light emitted by said LED, said ceramic wavelength converter converting at least a portion of the light emitted by said LED into light of a different wavelength, said ceramic wavelength converter comprising a chlorosilicate phosphor and having a density at least about 90% of theoretical density.

In a further aspect, there is provided a method of making a green-emitting ceramic wavelength converter for use with a light emitting diode, comprising the steps of obtaining a green-emitting chlorosilicate phosphor $Ca_8Mg(SiO_4)_4Cl_2$, having one or more activators selected from the group consisting of $Eu^{2+}$, $Mn^{2+}$, $Dy^{3+}$, or $Ce^{3+}$; and hot-pressing said phosphor at a temperature of 900-1100° C. in a slightly reducing atmosphere to achieve a density at least about 90% of theoretical density.

As used herein the term "ceramic wavelength converter" refers to a solid, monolithic, crystalline inorganic material that converts at least a portion of the light from an excitation source to light of a different wavelength. The ceramic wavelength converter has a density that is preferably at least about 90% of the theoretical density of the inorganic material that comprises it. More preferably, the ceramic wavelength converter has a density that is at least about 95% of theoretical density.

DETAILED DESCRIPTION OF THE INVENTION

Figure 1:
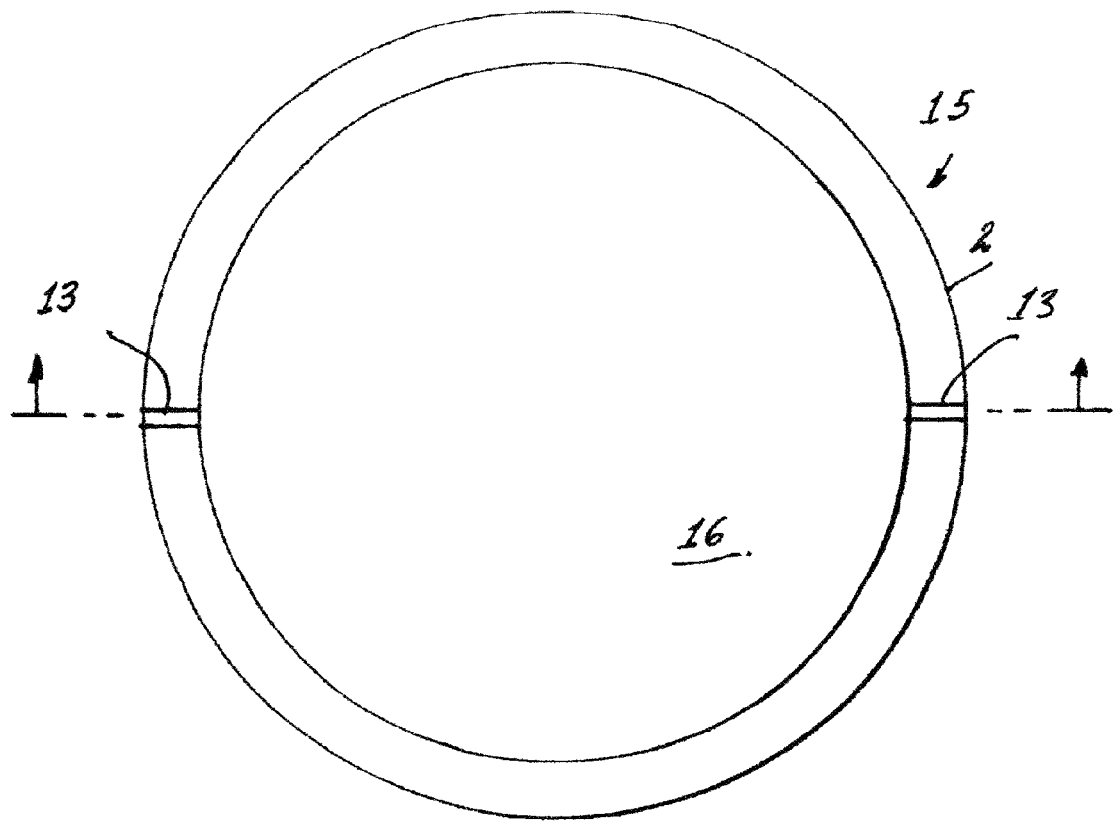
FIG. 1 is a diagrammatic plan view of a lighting system.

For purposes of this application it is to be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. The term "and/or" includes any and all combinations of one or more of the associated listed items.

Although the terms "first," "second," "third" etc. may be used to describe various elements, components, regions, layers and/or sections, these elements, components, regions, layers and/or sections are not to be limited by theses terms as they are used only to distinguish one element, component, region, layer or section from another element, component, region, layer or section. Thus, a first element, component, region, layer or section could be termed a second element, component, region, layer or section without departing from the scope and teachings of the present invention.

Spatially relative terms, such as "beneath," below," upper," "lower," "above" and the like may be used herein for ease of description to describe one element or feature's relationship to another element(s) or feature(s) as illustrated in the drawings. These spatially relative terms are intended to encompass different orientations of the device in use or operation in addition to the orientation shown in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. For example, as used herein, the singular forms "a," "an" and "the" are intended to include the plural forms as well, unless the context clearly indicates otherwise. It will be further understood that the terms, "comprises" and/or "comprising," when used in this specification, specify the presence of stated features, integers, steps operations, elements, and/or components, but do not preclude the presence or addition of one or more other features, integers, steps, operations, elements, components, and/or groups thereof.

For a better understanding of the present invention, together with other and further objects, advantages and capabilities thereof, reference is made to the following disclosure and appended claims taken in conjunction with the above-described drawings.

Figure 2:
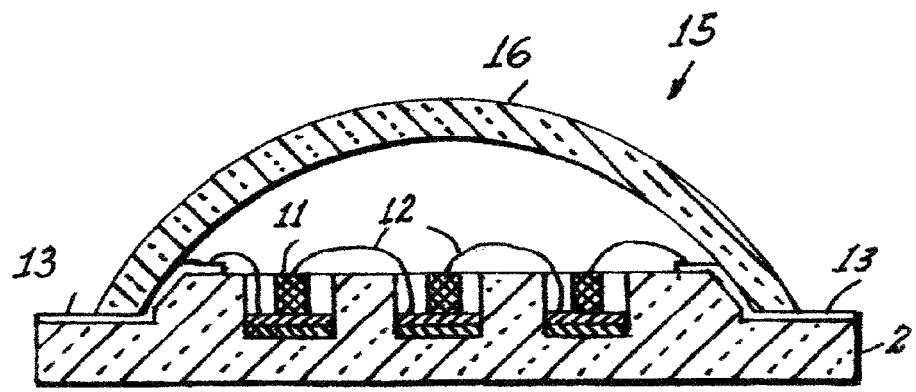
FIG. 2 is a sectional view taken along the line 2-2 of FIG. 1.

Referring now to the drawings with greater particularity, there is shown in FIG. 1 a light source 15 comprising a substrate 2, a ceramic wavelength converter 16 and electrical lead-ins 13. The light source 15 is more clearly illustrated in the sectional view of FIG. 2, wherein the substrate 2 is provided with cup-shaped pockets that receive radiation sources 11 interconnected by wires 12. The radiation sources 11 can be blue or ultraviolet emitting LEDs and the wavelength converter 16 is a sintered chlorosilicate phosphor that emits light in the green region of the electromagnetic spectrum upon excitation by the radiation emitted by the sources 11. Preferably, the LEDs emit in a range from 420 nm to 490 nm.

While the wavelength converter 16 is illustrated as being a dome, it is to be understood that this is exemplary only and any suitable configuration can be employed.

In a particular embodiment the phosphor is a green-emitting, europium-activated chlorosilicate phosphor having a formula $Ca_8Mg(SiO_4)_4Cl_2:Eu^{2+}$. The ceramic wavelength converter is sintered by hot-pressing in a slightly reducing atmosphere, preferably nitrogen gas containing 4% hydrogen gas ($N_2$-4% $H_2$). Additional activators and/or co-activators can be chosen from the group consisting of $Mn^{2+}$, $Dy^{3+}$, and $Ce^{3+}$.

Table I below indicates the various temperatures (in degrees C.), times (in minutes) and pressures (ksi, i.e., $10^3$ pounds per square inch), used to provide sintered materials achieving densities from 91.1 to 100% of theoretical. In each instance the comparison is made to the calculated density of the material being 3.03 g/cc.

TABLE I

| PHOSPHOR | TEMP, C. | TIME, MIN. | PRESSURE, KSI | DENSITY, % OF THEORETICAL |
|---|---|---|---|---|
| (1) $Ca_8Mg(SiO_4)_4Cl_2:Eu^{2+}$ | 1100 | 30 | 2 | 100 |
| (2) $Ca_8Mg(SiO_4)_4Cl_2:Eu^{2+}$ | 1000 | 30 | 2 | 98.8 |
| (3) $Ca_8Mg(SiO_4)_4Cl_2:Eu^{2+}$ | 900 | 45 | 2 | 91.9 |
| (4) $Ca_8Mg(SiO_4)_4Cl_2:Eu^{2+}$ | 1000 | 30 | 2 | 93.1 |
| (5) $Ca_8Mg(SiO_4)_4Cl_2:Eu^{2+}$ | 1050 | 30 | 2.5 | 93.7 |
| (6) $Ca_8Mg(SiO_4)_4Cl_2:Eu^{2+}$ | 1050 | 30 | 2.5 | 95.7 |

In TABLE I the materials labeled (1) and (2) are conventional grade phosphor materials (particle size range from 5 to 15 microns) while the remainder are finer powder materials having a particle size of about 5 microns.

In each instance the emitted wavelength was within the range of 510 to 540 nm, a range of wavelengths missing from the prior art.

Graphite dies and punches are used for uniaxial hot-pressing, with molybdenum foil spacers (as reaction barriers between the carbon and $Ca_8Mg(SiO_4)_4Cl_2:Eu^{2+}$).

For pressureless sintering, $Ca_8Mg(SiO_4)_4Cl_2:Eu^{2+}$ powder is first doped with a 1% lithium fluoride sintering aid, uniaxially cold-pressed and isopressed, placed in a molybdenum boat, and sintered in $N_2$ with 4% $H_2$ at 1100° C. for 4 hours to a density of >95% theoretical.

Figure 3:
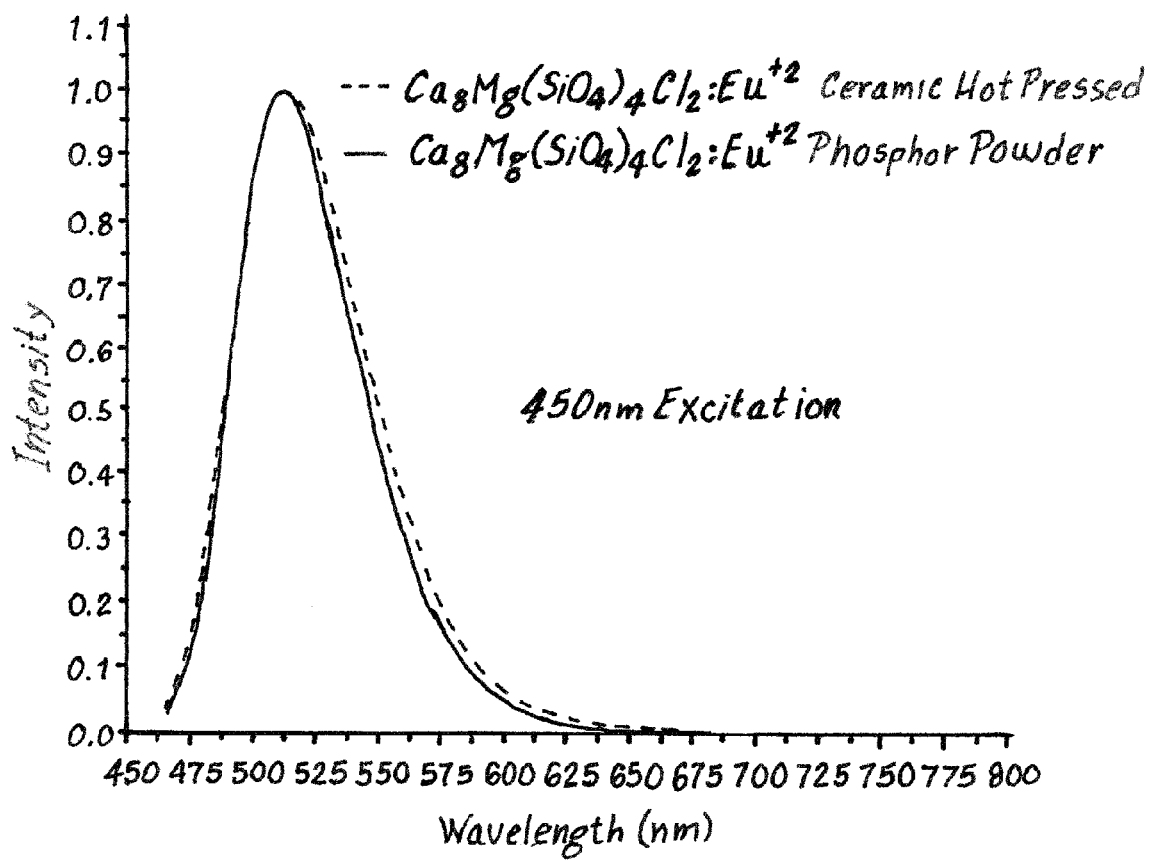
FIG. 3 is a graph of emission spectra comparing hot-pressed parts and original phosphor powders.

FIG. 3 illustrates the fact that the emission spectra of the hot-pressed parts are quite similar to those of the original phosphor powders. In the graph the solid line indicates the emission spectra of the phosphor powder and the dashed line indicates the emission spectra of the hot-pressed ceramic material. The measurements were made in an integrating sphere spectrophotometer. The reflectance spectra of the hot-pressed parts showed the expected absorption at ~450 nm, supported by the fixed-angle dispersed reflectance measurements. The phosphor powders maintained the same crystal structure and the luminescent ions kept the same valence during the hot-pressing treatment, which is supported also by the transmission data on thin sections of the hot-pressed chlorosilicate parts.

Figure 4:
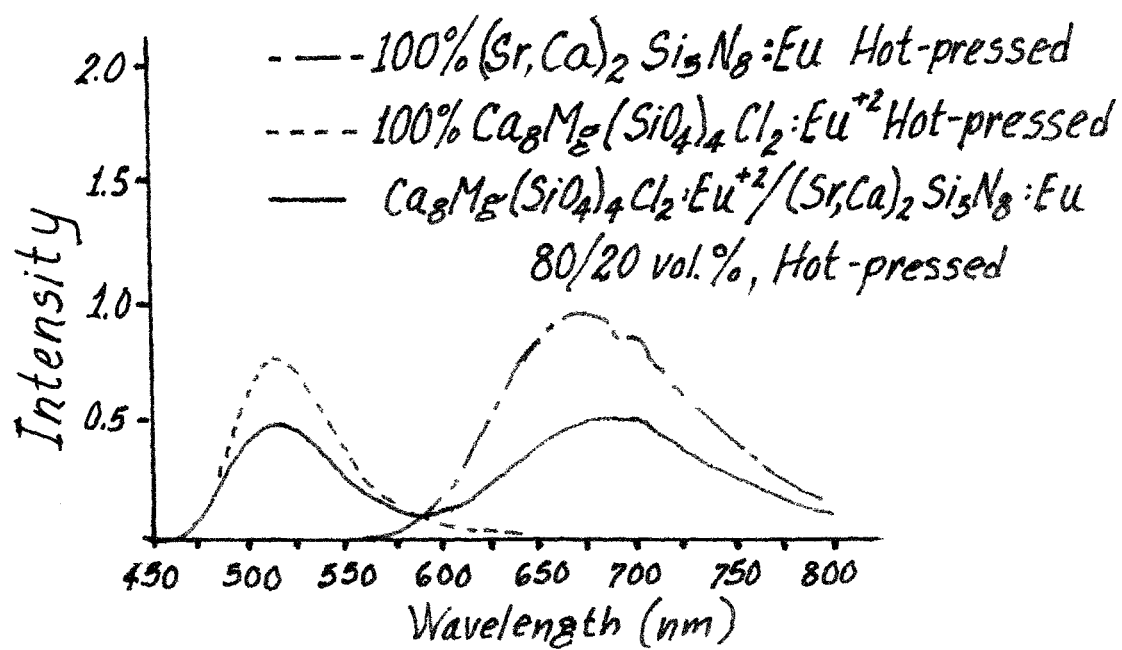
FIG. 4 is a graph of composite materials indicating retained emission characteristics after hot-pressing.

For composites containing $Ca_8Mg(SiO_4)_4Cl_2:Eu^{2+}$ plus another, different phosphor, $(Sr,Ca)_2Si_5N_8:Eu$, the powders were mixed and hot-pressed under nitrogen or nitrogen containing 4% hydrogen for 30 minutes at 2-10 ksi to >95% density. The composite included 80 vol. % of the $Ca_8Mg(SiO_4)_4Cl_2:Eu^{2+}$ and 20 vol. % of the $(Sr,Ca)_2Si_5N_8:Eu$. Emission spectra for such composites (see FIG. 4) indicated that they appeared to retain the green/red emission of the original materials. In the graph of FIG. 4, the "dot-dash-dot" line represents the $(Sr,Ca)_2Si_5N_8:Eu$ (a red emitting phosphor) after hot-pressing; the "dashed" line represents the $Ca_8Mg(SiO_4)_4Cl_2:Eu^{2+}$ (the green emitting phosphor) after hot-pressing, and the "solid" line presents the 80/20 ratio of the composite, again after hot-pressing.

It is anticipated that as finer particle size and higher purity phosphor powders with various levels of activators become available, higher levels of translucency and nearly zero porosity may be achieved by hot-pressing at even lower temperatures.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. An LED light source, comprising: an LED and a ceramic wavelength converter positioned to receive at least a portion of the light emitted by said LED, said ceramic wavelength converter converting at least a portion of the light emitted by said LED into light of a different wavelength, said ceramic wavelength converter comprising a chlorosilicate phosphor and having a density at least about 90% of theoretical density.

2. The LED light source of claim 1 wherein said chlorosilicate phosphor is a green-emitting phosphor.

3. The LED light source of claim 1 said ceramic wavelength converter includes a second phosphor.

4. The LED light source of claim 3 wherein said second phosphor is $(Sr,Ca)_2Si_5N_8:Eu$.

5. The LED light source of claim 1 wherein said chlorosilicate phosphor is $Ca_8Mg(SiO_4)_4Cl_2$, having one or more activators selected from the group consisting of $Eu^{2+}$, $Mn^{2+}$, $Dy^{3+}$, or $Ce^{3+}$.

6. The LED light source of claim 2 wherein said green-emitting chlorosilicate phosphor is $Ca_8Mg(SiO_4)_4Cl_2:Eu^{2+}$.

7. A ceramic wavelength converter comprised of a chlorosilicate phosphor $Ca_8Mg(SiO_4)_4Cl_2$, having one or more activators selected from the group consisting of $Eu^{2+}$, $Mn^{2+}$, $Dy^{3+}$, or $Ce^{3+}$ and having a density at least about 90% of theoretical density.

8. The ceramic wavelength converter of claim 7 wherein the converter is comprised of $Ca_8Mg(SiO_4)_4Cl_2:Eu^{2+}$.

9. A method of making a ceramic wavelength converter for use with a light emitting diode, comprising the steps of:
obtaining a chlorosilicate phosphor $Ca_8Mg(SiO_4)_4Cl_2$, having one or more activators selected from the group consisting of $Eu^{2+}$, $Mn^{2+}$, $Dy^{3+}$, or $Ce^{3+}$; and
hot-pressing said phosphor at a temperature of 900-1100° C. in a slightly reducing atmosphere to achieve a density at least about 90% of theoretical density.

10. The method of claim 9 wherein said phosphor has a particle size of 5-15 microns.

11. The method of claim 9 wherein said phosphor is hot pressed at a pressure of 2-2.5 ksi in an atmosphere of $N_2$ containing 4% $H_2$.

12. The method of claim 9 wherein a second phosphor is combined with said chlorosilicate phosphor to form a phosphor mixture prior to hot pressing, said second phosphor having a formula $(Sr,Ca)_2Si_5N_8:Eu$.

13. The method of claim 12 wherein said chlorosilicate phosphor comprises 80 volume % of said mixture and said second phosphor comprises 20 volume % of said mixture.

14. The method of claim 12 wherein the chlorosilicate phosphor has a formula $Ca_8Mg(SiO_4)_4Cl_2:Eu^{2+}$.

* * * * *